United States Patent
Xu et al.

(10) Patent No.: US 12,137,516 B2
(45) Date of Patent: Nov. 5, 2024

(54) PACKAGE WITH SELF SHIELDING

(71) Applicant: Avago Technologies International Sales Pte. Limited, Singapore (SG)

(72) Inventors: Hongya Xu, Taufkirchen (DE); Valter Pasku, Munich (DE); Martin Handtmann, Riemerling (DE); Lueder Elbrecht, Munich (DE); Li Sun, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 217 days.

(21) Appl. No.: 17/961,235

(22) Filed: Oct. 6, 2022

(65) Prior Publication Data

US 2024/0121884 A1 Apr. 11, 2024

(51) Int. Cl.
*H05K 1/02* (2006.01)
*H01L 23/498* (2006.01)
*H01L 23/552* (2006.01)

(52) U.S. Cl.
CPC ..... *H05K 1/0222* (2013.01); *H01L 23/49827* (2013.01); *H01L 23/552* (2013.01)

(58) Field of Classification Search
CPC .... H05K 1/0222; H05K 1/0219; H05K 1/183; H05K 1/185; H05K 2201/09618; H05K 3/4697
See application file for complete search history.

(56) References Cited

U.S. PATENT DOCUMENTS

| | | | |
|---|---|---|---|
| 5,151,769 A * | 9/1992 | Immorlica, Jr. | H01L 23/66 257/659 |
| 5,866,943 A | 2/1999 | Mertol | |
| 6,404,052 B1 | 6/2002 | Kurita et al. | |
| 7,245,884 B2 | 7/2007 | Oida et al. | |
| 8,432,022 B1 * | 4/2013 | Huemoeller | H01L 24/19 257/659 |
| 8,686,543 B2 | 4/2014 | Bergemont et al. | |
| 8,890,628 B2 | 11/2014 | Nair et al. | |
| 9,401,347 B2 | 7/2016 | Lee et al. | |
| 10,319,685 B2 | 6/2019 | Wong et al. | |
| 10,827,617 B2 | 11/2020 | Zhang et al. | |
| 11,355,829 B2 | 6/2022 | Bates | |
| 2002/0096767 A1 | 7/2002 | Cote et al. | |
| 2011/0298111 A1 | 12/2011 | Kim | |
| 2012/0167384 A1 | 7/2012 | Sun et al. | |
| 2015/0187676 A1 | 7/2015 | Won et al. | |
| 2016/0020177 A1 | 1/2016 | Tam | |
| 2016/0148881 A1 * | 5/2016 | Park | H01L 23/60 257/659 |
| 2017/0194300 A1 * | 7/2017 | Lin | H01L 24/19 |
| 2017/0223839 A1 | 8/2017 | Jain et al. | |
| 2019/0259676 A1 | 8/2019 | Dresser | |
| 2020/0205280 A1 * | 6/2020 | Lee | H05K 3/4644 |
| 2021/0307218 A1 | 9/2021 | Paynter et al. | |
| 2022/0045014 A1 | 2/2022 | Chen et al. | |

* cited by examiner

*Primary Examiner* — Sherman Ng
(74) *Attorney, Agent, or Firm* — Quarles & Brady LLP (57) ABSTRACT

One way to stop electromagnetic fields from leaking outside of a module is an electric wall. Embodiments of the present disclosure are directed to emulating an electric wall with through vias. The through vias may be arranged around cavities in the printed circuit board. The density of the through vias may be selected based on an expected wavelength of the electromagnetic fields. The printed circuit board may then self-isolate components within the cavities from the electromagnetic fields.

17 Claims, 5 Drawing Sheets

PACKAGE WITH SELF SHIELDING

TECHNICAL FIELD

The present invention generally relates to semiconductor packages, and more specifically to protecting semiconductor packages against electromagnetic fields (EMF).

BACKGROUND

There is steady demand for the solid-state modules inside electronic products, such as cellular telephones, personal communication devices, and portable computers, to be physically smaller. Module size reduction is a driving factor in module design. Limiting factors that affect the height of the solid-state module include printed circuit boards (PCBs) and various dies mounted to either or both sides of the PCBs.

The module may include one or more dies. The dies may receive electromagnetic fields (EMF) which may induce electromagnetic interference (EMI) in the dies. The module may include shielding for the dies. For example, the module may cover a top layer of the PCB with a mold (e.g., an epoxy mold). The mold may then be covered with a sputtered shield. The sputtered shield may also be coupled to the PCB by one or more of wire bonds. The wire bonds provide grounding to the sputtered shield, such that the sputtered shield may function as an electromagnetic shield for the dies. Forming the mold, the sputtered shield, and the wire bonds may require a number of processing steps impacting the complexity and cost of the module. Additionally, the overall thickness of the module is relatively high due to the mold occupying a substantial height of the PCB. In view of the above, one or more embodiments of the present disclosure provide a module with shielding and a reduced height.

SUMMARY

A printed circuit board is described, in accordance with one or more embodiments of the present disclosure. In some embodiments, the printed circuit board comprises a plurality of metal layers. In some embodiments, the plurality of metal layers comprises a first metal layer, a second metal layer, and one more intermediate metal layers. In some embodiments, the one or more intermediate metal layers are disposed between the first metal layer and the second metal layer. In some embodiments, the first metal layer comprises a metal trace. In some embodiments, the printed circuit board comprises one or more dielectric layers. In some embodiments, the one or more dielectric layers comprise a first dielectric layer disposed between the first metal layer and the one or more intermediate metal layers. In some embodiments, the one or more dielectric layers comprise a second dielectric layer disposed between the one or more intermediate metal layers and the second metal layer. In some embodiments, the printed circuit board defines a first cavity recessed from the second metal layer. In some embodiments, the one or more intermediate metal layers comprises a metal layer disposed in the cavity. In some embodiments, the printed circuit board comprises a plurality of through vias. In some embodiments, the plurality of through vias are coupled between the first metal layer and the second metal layer. In some embodiments, the plurality of through vias are arranged around a perimeter of the first cavity. In some embodiments, each of the plurality of through vias are spaced from adjacent through vias of the plurality of through vias. In some embodiments, the metal trace couples the plurality of through vias.

An apparatus is described, in accordance with one or more embodiments of the present disclosure. In some embodiments, the apparatus comprises a printed circuit board. In some embodiments, the printed circuit board includes a plurality of metal layers. In some embodiments, the plurality of metal layers comprises a first metal layer, a second metal layer, and one more intermediate metal layers. In some embodiments, the one or more intermediate metal layers are disposed between the first metal layer and the second metal layer. In some embodiments, the first metal layer comprises a metal trace. In some embodiments, the printed circuit board comprises one or more dielectric layers. In some embodiments, the one or more dielectric layers comprise a first dielectric layer disposed between the first metal layer and the one or more intermediate metal layers. In some embodiments, the one or more dielectric layers comprise a second dielectric layer disposed between the one or more intermediate metal layers and the second metal layer. In some embodiments, a first cavity is defined in the second metal layer. In some embodiments, the one or more intermediate metal layers comprises a metal layer disposed in the cavity. In some embodiments, the printed circuit board comprises a plurality of through vias. In some embodiments, the plurality of through vias are coupled between the first metal layer and the second metal layer. In some embodiments, the plurality of through vias are arranged around a perimeter of the first cavity. In some embodiments, each of the plurality of through vias are spaced from adjacent through vias of the plurality of through vias. In some embodiments, the metal trace couples the plurality of through vias. In some embodiments, the apparatus comprises a die. In some embodiments, the die is coupled to the metal layer disposed in the cavity.

An apparatus is described, in accordance with one or more embodiments of the present disclosure. In some embodiments, the apparatus comprises a printed circuit board. In some embodiments, the printed circuit board comprises a plurality of metal layers. In some embodiments, the plurality of metal layers comprise a first metal layer, a second metal layer, and one or more intermediate metal layers. In some embodiments, the one or more intermediate metal layers are disposed between the first metal layer and the second metal layer. In some embodiments, the first metal layer comprises a metal trace. In some embodiments, the printed circuit board comprises one or more dielectric layers. In some embodiments, the one or more dielectric layers comprise a first dielectric layer disposed between the first metal layer and the one or more intermediate metal layers. In some embodiments, the one or more dielectric layers comprise a second dielectric layer disposed between the one or more intermediate metal layers and the second metal layer. In some embodiments, a first cavity is defined in the second metal layer. In some embodiments, the one or more intermediate metal layers comprise a metal layer disposed in the first cavity. In some embodiments, the printed circuit board comprises a plurality of through vias. In some embodiments, the plurality of through vias are coupled between the first metal layer and the second metal layer. In some embodiments, the plurality of through vias are arranged around a perimeter of the first cavity in a rectangular pattern. In some embodiments, the perimeter of the first cavity is rectangular. In some embodiments, the metal trace couples the plurality of through vias in a grid pattern. In some embodiments, the grid pattern comprises a first portion of the metal trace arranged outside the rectangular pattern. In some embodiments, the grid pattern comprises a second portion of the metal trace arranged inside the rectangular pattern.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF THE INVENTION

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

It is noted herein "coupled" may mean one or more of communicatively coupled, electrically coupled, and/or physically coupled for the purposes of the present disclosure. When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present. It is noted herein that by being "coupled between", it may be understood to be relative to movement or flow of a signal between two or more components, and may additionally include intervening components therein. Similarly, descriptions that a particular component is "fabricated over", "located on", or "disposed on" another component indicates a relative position of such components but does not necessarily indicate that such components are physically in contact. Such components may be in physical contact or may alternatively include intervening elements. An electrical coupling or electrical connection may refer to the ability of electrical energy to flow between components. A mechanical coupling or mechanical attachment may refer to a physical support of components.

U.S. Pat. No. 10,827,617, titled "Printed circuit board with cavity", naming Dingyou Zhang, Nitesh Kumbhat, Li Sun, Sarah Haney, and Chang Kyu Choi as inventors, is incorporated herein by reference in the entirety.

Reference will now be made in detail to the subject matter disclosed, which is illustrated in the accompanying drawings. Embodiments of the present disclosure are generally directed to a module. The module may include one or more printed circuit boards (PCBs) and one or more dies. The dies of the modules may generate electromagnetic fields (EMF) which induce electromagnetic interference (EMI). The PCB may include shielding to reduce or block the EMF. The shielding may be achieved internally to the PCB. The ability to achieve the shielding internally may allow for modules with a thinner height, as compared to a module with a sputtered shield over a molding compound. The operable principle of EMF shielding may be by providing a conductive material in connection to ground. The EMF may then induce a current in the conductive material, thereby reducing a strength of the EMF.

Figure 1A:
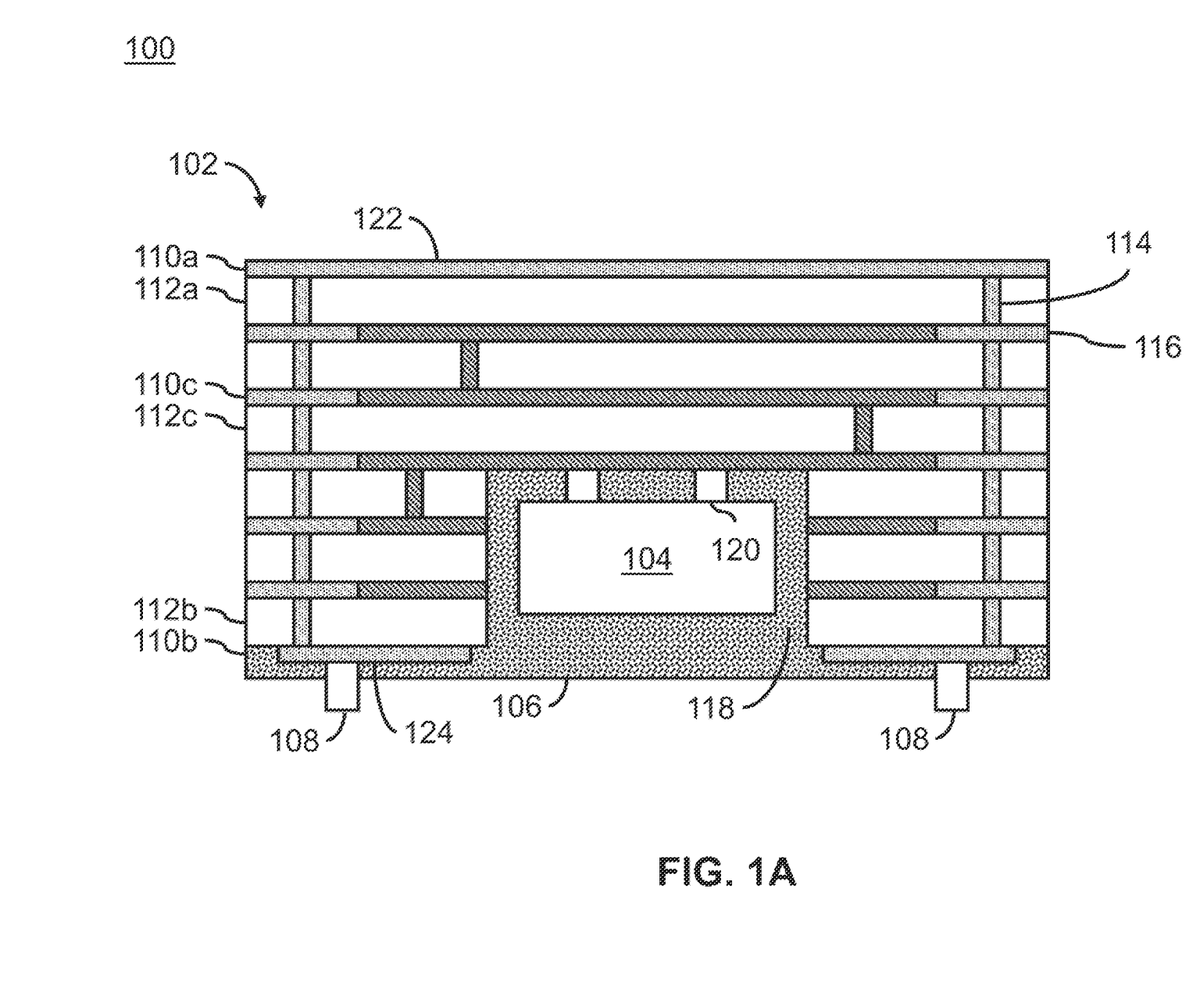
FIG. 1A depicts a side view of module including a printed circuit board with a cavity, in accordance with one or more embodiments of the present disclosure.
Figure 1B:
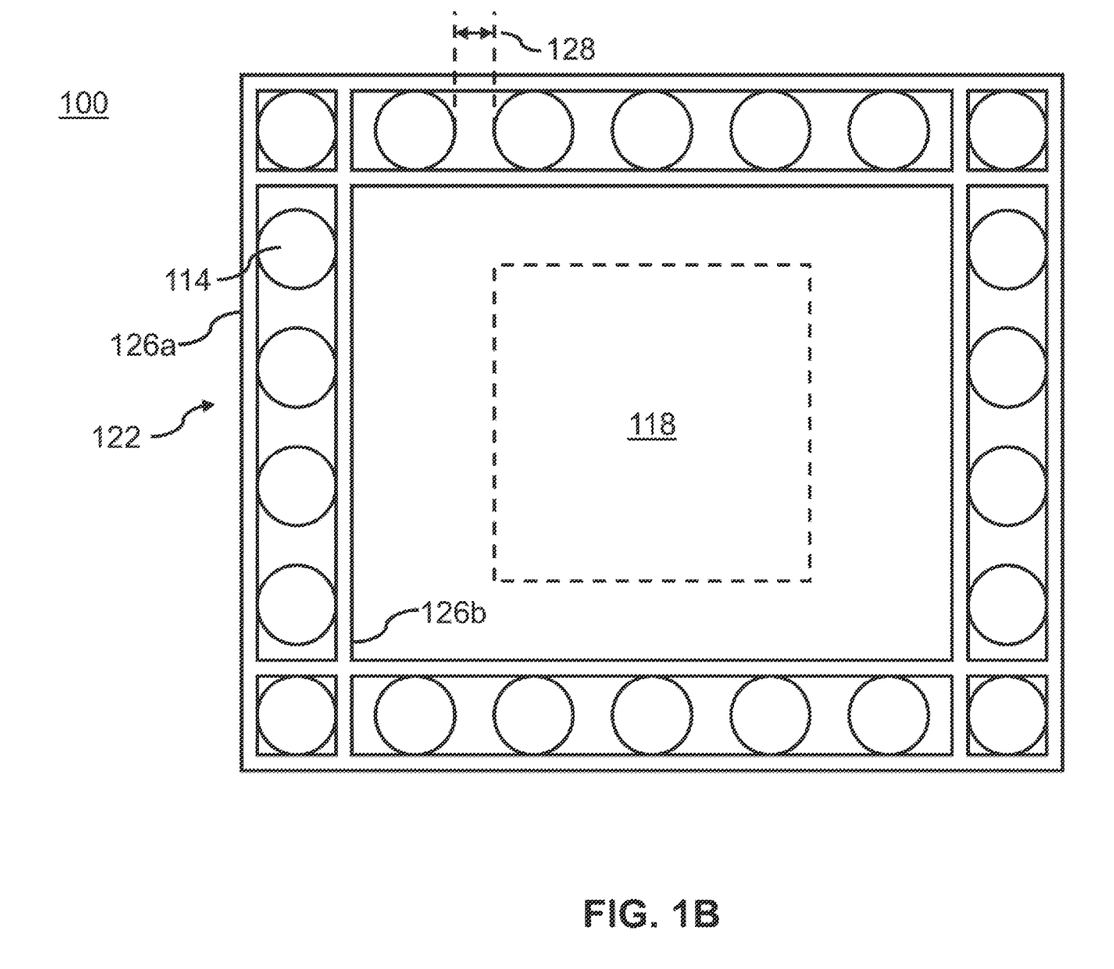
FIG. 1B depicts a top view of module including a printed circuit board with a cavity, in accordance with one or more embodiments of the present disclosure.

Referring now to FIGS. 1A-1B, a module 100 is described, in accordance with one or more embodiments of the present disclosure. The module 100 may also be referred to as an apparatus. In embodiments, the module 100 may be referred to as a radio frequency (RF) front-end module (FEM). The module 100 may shielded from electromagnetic interference (EMI) for RF applications. The module 100 may be used in a number of radio frequency (RF) applications, such as, but not limited to, a radio frequency (RF) module of a mobile phone or another communication device. In such RF applications, designs of the module 100 may be sensitive to size and cost requirements. The module 100 may further include one or more filters, amplifiers, oscillators, and the like. In some instances, the RF front end is placed onto the motherboard of a communication device. The RF front end may be placed on the motherboard for filtering or amplifying a signal of the communication device. It is further contemplated that the module 100 may include applications other than as an RF module or an RF front end.

The module 100 may include one or more components, such as, but not limited to, a printed circuit board 102 (PCB). The overall height for the module 100 may be determined by the thickness of the printed circuit board 102 among other factors. The module 100 may also include one or more dies 104, mold 106, interconnects 108, metal layers 110, insulating layers 112, through vias 114, annular rings 116, cavity 118, and/or interconnects 120. In embodiments, the printed circuit board 102 may include, be coupled to, or define one or more of the one or more dies 104, mold 106, interconnects 108, metal layers 110, insulating layers 112, through vias 114, annular rings 116, cavity 118, and/or interconnects 120.

The printed circuit board 102 may include the metal layers 110. The metal layers 110 may carry electrical signals or current. The metal layers 110 may be fabricated by any printed circuit board fabrication process. The metal layers 110 may be formed of any electrically conductive material compatible with fabrication of printed circuit boards. For example, the material may include, but is not limited to, copper (Cu), gold (Au), silver (Ag) and/or aluminum (Al). The metal layers 110 may also be referred to as metallization layers, signal layers, and/or electrically conductive layers. The metal layers 110 may include a metal which is patterned to form pathways (e.g., traces), components, and the like. The components may include, but are not limited to, resistors (e.g., thin-film resistor (TFR), etc.), capacitors (e.g., metal-insulator-metal (MIM) capacitors, deep-trench capacitors (TC), metal-oxide-semiconductor (MOS) capacitor, metal fringe capacitors, etc.), inductors (e.g., a planar spiral inductor, etc.), transistors, and the like. The components may be considered "integrated" by being formed by the metal layers 110. Integrating the components in the printed circuit board 102 may be advantageous to reduce an in-plane dimension of the printed circuit board 102. The pathways and/or components may be fabricated as patterned layers. The patterned layers may be formed using any suitable process, such as, but not limited to, using a lithographic processing technique. As an illustration, a patterned layer may be formed by deposition of a photoresist, exposing the photoresist with a pattern, etching the photoresist and one or more layers of underlying material to form a patterned structure.

The printed circuit board 102 may also include the dielectric layers 112. The dielectric layers 112 may fabricated by any printed circuit board fabrication process. The dielectric layers 112 may be formed of any electrically insulating material compatible with fabrication of printed circuit boards, such as, but not limited to, a prepreg material, resin-based dielectric material (e.g., FR-4), Benzocyclobutene (BCB), and the like. The dielectric layers 112 may also be referred to as isolation layers, pre-peg layers, core layers, and the like. The dielectric layers 112 may be disposed between the metal layers 110. Thus, the printed circuit board 102 may include the metal layers 110 separated by the dielectric layers 112. The dielectric layers 112 may then electrically insulate the metal layers 110 preventing unwanted signal leakage.

In embodiments, the printed circuit board 102 may be considered a multilayer PCB. The printed circuit board 102 may include multiple layers of the metal layers 110 and multiple layers of the dielectric layers 112. The metal layers 110 may include a first metal layer 110a, a second metal layer 110b, and one or more intermediate metal layers 110c. The intermediate metal layers 110c may be disposed between the first metal layer 110a and the second metal layer 110b. The first metal layer 110a may also be referred to as a top metal layer. The second metal layer 110b may also be referred to as a bottom metal layer. The metal layers 110 may be referred to the based on a position of the layer. The dielectric layers 112 may be disposed between each of the first metal layer 110a, the intermediate metal layers 110c, and the second metal layer 110b thereby insulating the various layers. The dielectric layers 112 may include a first dielectric layer 112a, a second dielectric layer 112b, and one or more intermediate dielectric layers 110c. The intermediate dielectric layers 112c may be disposed between the first dielectric layer 112a and the second dielectric layer 112b. In embodiments, the first metal layer 110a may be disposed above the first dielectric layer 112b. In embodiments, the second metal layer 110b may be disposed below the second dielectric layer 112b. In embodiments, the metal layers 110 may or may not include the same thickness.

For example, the printed circuit board 102 is depicted as including seven of the metal layers 110 which are each separated by the dielectric layers 112, although this is not intended to be limiting. For the example depicted with seven of the metal layers, the first metal layer 110a may be referred to as a metal 1 (M1) layer and the second metal layer 110b may be referred to as a metal layer 7 (M7), with the intermediate metal layers 110c referred to as metal layers 2 through 6 (M2 through M6). The concepts may be extended to a PCB including any number (n) of the layers (e.g., Mn).

The printed circuit board 102 may further include one or more circuits formed across one or more of the metal layers 110. For example, the metal layers may be coupled by one or more vias (e.g., blind vias, buried vias, the through vias 114, etc.). The one or more vias may form the one or more circuits across the metal layers by coupling the pathways, the components, and the like. The circuits may be arranged to achieve a desired function for the printed circuit board 102, such as, but not limited to, I/O circuitry for a radio frequency (RF) module. As may be understood, the specific routing may be based on the desired circuit coupling such that the various figures provided herein are not intended to be limiting. In this way, single or multi-layer circuits may be formed based on one or more patterned layers.

Although the printed circuit board 102 is described as including the metal layers 110 and the dielectric layers 112, this is not intended to be a limitation of the present disclosure. The printed circuit board 102 may further include a number of other layers used in printed circuit board fabrication, such as, but not limited to, solder mask layers and the like. For example, solder mask layers (not depicted) may be applied over the first metal layer 110a and/or the second metal layer 110b.

In embodiments, the printed circuit board 102 may define one or more of the cavities 118. In this regard, the printed circuit board 102 may referred to as a cavity PCB. The cavity 118 may be defined by the second metal layer 110b. The cavities 118 may be recessed from the second metal layer 110b. Recessed may refer to forming the cavity 118 may in a surface of the printed circuit board 102 such that the surface is not flat across the entire printed circuit board 102. The cavity may also be defined by one or more dielectric layers of the printed circuit board 102. The cavity 118 may refer to a hole in a surface of the printed circuit board through to one or more of the intermediate metal layers 110c. As depicted, the cavity 118 is formed on the bottom surface, although this is not intended to be limiting. The cavity 118 may be formed from the printed circuit board 102 by any suitable process, such as etching, laser ablation, or using patternable photosensitive materials. The intermediate metal layers 110c may include a metal layer disposed in the cavity 118. The depth of the cavity 118 may be selected based on a distance to the desired intermediate metal layer. The cavity 118 may include cavity depth of one or more layers. For the example depicted, the cavity 118 includes a cavity depth of three layers from the metallization layer M7 thereby exposing metallization layer M4, although this is not intended to be limiting. Thus, the cavity 118 exposes one of the one or more intermediate metal layers 110c.

In embodiments, the printed circuit board 102 includes one or more of the interconnects 120. The interconnects 120 may be disposed within the cavity 118. The metal layer disposed in the cavity 118 may include one or more of the interconnects 120. The interconnects may be coupled to the intermediate metal layer which is exposed by the cavity 118 (e.g., M4 for the example depicted). The interconnects 120 may include, but are not limited to, bumps, solder pads, landing pads, solder balls, and the like. The interconnects 120 may be configured to electrically couple to the dies 104. For example, the metal layer disposed in the cavity 118 may include pads for coupling the dies 104. The metal layer disposed in the cavity 118 may be patterned to have solder bumps landed in the cavity 118. The solder bumps may be melted and wetted to the metal layers of the printed circuit board 102 during reflow, followed by cooling to form a solid joint with the interconnects 120.

In embodiments, the module 100 includes one or more of the dies 104. The cavity 118 may be configured to receive the dies 104. Receiving the dies 104 may refer to the cavity 118 having sufficient dimensions such that the dies 104 are at least partially disposed within the cavity 118. In embodiments, the dies 104 may be disposed within the cavities 118. Disposing the dies 104 within the cavity 118 may lower the standoff height of the dies 104 relative to the printed circuit board 102, as compared to attaching the dies 104 on the surface of the printed circuit board 102. Reducing the standoff height of the dies 104 may be beneficial in reducing the overall height of the module 100. The reduction in height of the module 100 may correspond to the cavity depth. In embodiments, the dies 104 may electrically couple to the metal layer disposed within the cavity 118 by way of the interconnects 120, although this is not intended to be limiting.

The dies 104 may include any die suitable for printed circuit board fabrication. For example, the dies 104 may include, but are not limited to, power amplifier cores, multiplexers, switches, low noise amplifiers, CMOS die, a silicon on insulator (SOI) die, an integrated passive device (IPD) die, a filter die (e.g., a film bulk acoustic resonator (FBAR) filter, surface acoustic wave (SAW) filter, etc.), a bank of silicon capacitors, a discrete passive component, and the like. As used herein, passive may refer to an inductor, a resistor, a capacitor, and the like. The dies 104 may be selected from any of the above to achieve a desired functionality for the module 100.

In embodiments, the dies 104 may transmit and/or receive electromagnetic fields (EMF). EMF may undesirable induce electric current, also referred to as electromagnetic interference (EMI). The EMF transmitted by the dies 104 may induce EMI in electronic components surrounding the dies 104. Similarly, the EMF received by the dies 104 may induce EMI in the dies 104. In some instances, the dies 104 and/or the surrounding components may be sensitive to the EMI, such that reducing the EMF is desirable. The EMF may include a frequency and wavelength. For example, the EMF may include a frequency between 1 MHz and 10 GHz. By way of another example, the EMF may include a wavelength between 3 cm and 300 m.

In embodiments, the printed circuit board 102 includes a shielding structure. The shielding structure may reduce or block a strength of the EMF passing to and from the cavity 118. For example, the shielding structure may include a shielding efficiency or gain reducing the EMF. The shielding structure may include, but is not limited to, the through vias 114, the annular rings 116, and/or a metal trace 122. The through vias 114, the annular rings 116, and/or the metal trace 122 may be configured to reduce or block a strength of the EMF passing to and from the cavity 118. The through vias 114, the annular rings 116, and/or the metal trace 122 may internal to the printed circuit board 102. Implementing the shielding structure by the printed circuit board 102 may provide a number of advantages including decreasing the thickness of the module 100 and/or decreasing the number of fabrication steps of the module 100.

In embodiments, the printed circuit board 102 includes the through vias 114. The through vias 114 may fabricated by any printed circuit board fabrication process, such as, but not limited to a front end of line process or back end of line process. The through vias 114 may be formed of any electrically conducting material compatible with fabrication of printed circuit boards, such as the metals described in reference to the metal layers 110. The through vias 114 may be coupled between the first metal layer 110a and the second metal layer 110b (e.g., through the printed circuit board 102, from a top surface to a bottom surface). The metal of the through vias 114 may then electrically couple the first metal layer 110a to the second metal layer 110b. The electrical coupling between the first metal layer 110a to the second metal layer 110b may be used to ground the first metal layer 110a. Grounding may refer to a causing a voltage differential between a component and a reference point to approach zero. The through vias 114 may thus serve as a return line for electrical energy induced by the EMF.

In embodiments, the through vias 114 are arranged around the cavities 118 (see FIG. 1B). For example, the through vias 114 may be arranged around a perimeter of the cavities 118. Arranging around the perimeter may refer to placing the through vias spaced apart from the perimeter and in a pattern which is suitable to form a via-wall. The through vias 114 may be considered to form a via-wall by the arrangement. The term via-wall may mean that electromagnetic waves will not leak outside the module 100. The via-wall may isolate the cavity 118 from the EMF around the sides of the printed circuit board 102. Advantageously, the through vias 114 may provide such isolation internally to the printed circuit board 102. The through vias 114 may provide isolation and shielding to the outside and to the other components which may be present within the printed circuit board 102. In embodiments, the perimeter of the cavity 118 is rectangular. In embodiments, the through vias 114 may be arranged in a pattern around the cavity 118. The pattern may define the location of the through vias 114. For example, the through vias may be arranged in a rectangular pattern around the cavity 118. In this regard, the perimeter of the pattern of the through vias 114 may also be rectangular when arranged around the perimeter of the cavity 118. The through vias may then be spaced apart from adjacent through vias in the pattern by a distance 128.

In embodiments, the through vias 114 may be spaced from adjacent through vias by a gap or distance 128. Each of the adjacent through vias in the pattern may be spaced according to the distance 128. The distance 128 between the adjacent through vias (e.g., the gap distance) may be selected based on the expected wavelengths of the EMF. The through vias 114 may be considered to form the via wall if the spacing between the through vias is sufficiently small relative to the wavelength. For example, the distance 128 between the through vias 114 may be on the order of one-quarter of the wavelength or lower. In embodiments, the distance 128 between adjacent through vias of the through vias 114 may be selected based on the wavelength of the electromagnetic field received by the through vias 114. The distance 128 may be selected to be less than or equal to one-fourth of the wavelength received. Moreover, the distance 128 between vias may or may not be the same as the diameter of the vias. The distance 128 between vias being the same as the diameter of the vias may provide for efficient shielding. The dies 104 may emit an electromagnetic field with a frequency. The electromagnetic field in the dielectric layers 112 may include a frequency which is different than a frequency of the electromagnetic field in free space. In some instances, the through vias 114 may receive the electromagnetic field from the dielectric layers 112 with a wavelength in the high frequency (HF) band, the very high frequency (VHF) band, the ultra high frequency (UHF) band, the super high frequency (SHF) band, the extremely high frequency (EHF) band and the like. In this regard, the electromagnetic field received by the through vias 114 may include a frequency up to a GHz or more. The distance 128 between the adjacent through vias may thus be selected to shield from electromagnetic fields having frequencies up to a GHz or more. The distance 128 may be further decreased as the wavelength of the module decreases (e.g., as the components operate at higher frequencies). In embodiments, the distance 128 between the through vias may also be based on the diameter of the through vias 114. The minimum gap distance between the through vias 114 may also be based on the technology used to fabricate the PCB. In embodiments, the distance 128 between the through vias may be between 20 mils and 50 mils. For example, the distance 128 between the through vias may be between 20 mils and 30 mils. By way of another example, the distance 128 between the through vias may be between 40 mils and 50 mils. The diameter of the through vias may be similarly between 20 mils and 50 mils. The distance 128 may be selected based on the module of interest, technology and frequency. PCB fabrication may include a design rule for the spacing between the vias. The design rule may include a minimum gap. For example, the distance 128 between the adjacent through vias may be between 20 mils and 30 mils (e.g., 0.002 and 0.003 inches, 0.0508 cm and 0.0762 cm), although this is not intended to be limiting. The distance 128 of between 20 mils and 30 mils may shield the cavity from electromagnetic fields with frequencies in the EHF band. For example, 30 mils may correspond to 0.762 mm, or a quarter of a wavelength of 3.048 mm (e.g., 98.357 GHz). By way of another example, 20 mils may correspond to 0.508 mm, or a quarter of a wavelength of 2.032 mm (e.g., 147.535 GHz). Thus, the distance 128 between the adjacent through vias may accommodate dies which operate with higher frequencies and lower wavelengths of EMF.

In embodiments, the first metal layer 110a may include the metal trace 122. The metal trace 122 may fabricated by any printed circuit board fabrication process. The metal trace 122 may generally include any metal suitable for printed circuit board fabrication, such as, but not limited to, the metals described in reference to the metal layers 110. The metal trace 122 of the first metal layer 110a may act as an EMF shield for the top of the printed circuit board 102. The metal trace 122 may couple each of the through vias 114 to the adjacent through vias. The metal trace 122 may conduct signals between the through vias. In this regard, the through vias 114 may be electrically coupled by the metal trace 122. The metal trace 122 may then provide the EMF shielding. The metal trace 122 and the through vias 114 may be configured to reduce a strength of electromagnetic fields (EMF) from passing to and from the cavity 118.

In embodiments, the metal trace 122 couples the through vias 114 in a grid pattern. The grid pattern of the metal trace 122 may include a first portion 126a of the metal trace 122 arranged outside the pattern defining the through vias 114. The first portion 126a around outside the pattern may be a largest rectangle touching each of the through vias 114. The grid pattern of the metal trace 122 may also include a second portion 126b of the metal trace 122 arranged inside the pattern defining the through vias 114. The second portion 126b may be a smallest rectangle touching each of the through vias 114. The first portion 126a may be coupled to the second portion 126b at the through vias 114 which are disposed at the corners of the rectangular pattern. In embodiments, the metal trace 122 is in a rectangular grid pattern where the perimeter of the cavity 118 and the pattern defining the location of the through vias 114 are rectangular. Each of the through vias 114 is thus coupled to the metal trace 122. The grid pattern may also include coupling the first portion 126a and the second portion 126b at the corner through vias. The grid pattern may leave the area above the cavity 118 uncovered by the metal trace 122.

In embodiments, the metal layers 110 may include one or more of the annular rings 116. The annular rings 116 may also be referred to as copper pads or ground rings. In embodiments, each of the metal layers 110 includes the annular rings 116. For example, each of the metal layers 110 may include one of the annular rings 116 for each of the through vias 114. The through vias 114 may then each be coupled to one of the annular rings 116 in each layer of the metal layers 110. The annular rings 116 may then couple the through vias 114 to one or more traces within the metal layers 110. The annular rings 116 that are not coupled to the traces within the metal layers 110 may be referred to as unused annular rings or unused pads. It is further contemplated that each of the metal layers 110 may not include one of the annular rings 116 for each of the through vias 114.

In embodiments, the printed circuit board 102 may include one or more interconnects 108. The interconnects 108 may be disposed below the second metal layer 110b. The interconnects 108 may be coupled to the second metal layer 110b of the printed circuit board 102. The interconnects 108 may include, but are not limited to, bumps, solder pads, landing pads, solder balls, and the like. The interconnects 108 may provide a coupling between the printed circuit board 102 and an external ground reference. For example, the interconnects 108 may couple with another structure (e.g., an external ground). In embodiments, the through vias 114 may couple to one or more of the interconnects 108. The through vias 114 may then ground the first metal layer 110a, the metal trace 122, and/or the annular rings 116 to the interconnects 108. The through vias 114 are coupled to the interconnects 108 for grounding the first metal layer 110a, the through vias 114, and/or the annular rings 116. Coupling to the ground reference may cause the shielding structure to have zero potential relative to the ground reference.

In embodiments, the second metal layer 110b includes a metal trace 124. The metal trace 124 may be similar to the metal trace 124. The metal trace 124 may generally include any metal suitable for printed circuit board fabrication, such as, but not limited to, the metals described in reference to the metal layers 110. The metal trace 124 may act as an EMF shield for the bottom of the printed circuit board 102. The metal trace 124 may couple each of the through vias 114 to the adjacent through vias. The metal trace 124 may also couple to the interconnects 108. The metal trace 124 may then function as EMF shielding for the bottom of the cavity 118. For example, the metal trace 124 may couple the through vias 114 in a grid pattern. The grid pattern of the metal trace 124 may be around and/or inside a perimeter of the through vias 114 (see FIG. 1B for example). Although the second metal layer 110b is described as including the metal trace 124, this is not intended as a limitation of the present disclosure. It is further contemplated that the bottom shielding for the cavity 118 may be provided by another structure, as will be described further by reference to FIG. 3.

In embodiments, the module 100 includes a mold 106. The mold 106 may also be referred to as a mold mask. The mold 106 may be formed of a reinforced or non-reinforced epoxy resin, an epoxy molding compound (EMC), and the like. The mold 106 may protect one or more portions of the module 100 (e.g., the dies 104, the cavity 118, the bottom side of printed circuit board 102). The mold 106 may be disposed on the bottom side of the printed circuit board 102. For example, the mold 106 may be formed over and fill the cavity 118. The mold 106 may then hermetically seal the dies 104. The hermetic seal may protect against environmental elements, such as temperature and moisture. Although the module 100 is described as including the mold 106, this is not intended as a limitation of the present disclosure.

As depicted, the printed circuit board 102 does not include a mold coupled above the first metal layer 110a, a sputtered metal layer coupled above the mold, and a wire bond coupled from the first metal layer 110a to the sputter layer. Advantageously, the printed circuit board 102 may be EMI shielded without needing the upper mold, sputtered metal, and wire bonds. Although the printed circuit board 102 is described as not needing a mold coupled above the first metal layer 110a, this is not intended as a limitation of the present disclosure. It is contemplated the module 100 may include the mold coupled above the first metal layer 110a to protect the first metal layer 110a.

As will be described further with reference to FIGS. 2A-2B, the printed circuit board 102 may define one or more additional cavities recessed from the second metal layer 110b. The through vias 114 may also be arranged around a perimeter of the one or more additional cavities. The through vias 114 may then form a via-wall around the one or more additional cavities. The metal trace 122 may also be coupled to the through vias around the perimeter of the cavity (e.g., in a grid pattern). The metal trace 122 and the through vias 114 may then be configured to reduce a strength of electromagnetic fields (EMF) passing between the cavity 118 and the one or more additional cavities.

Figure 2A:
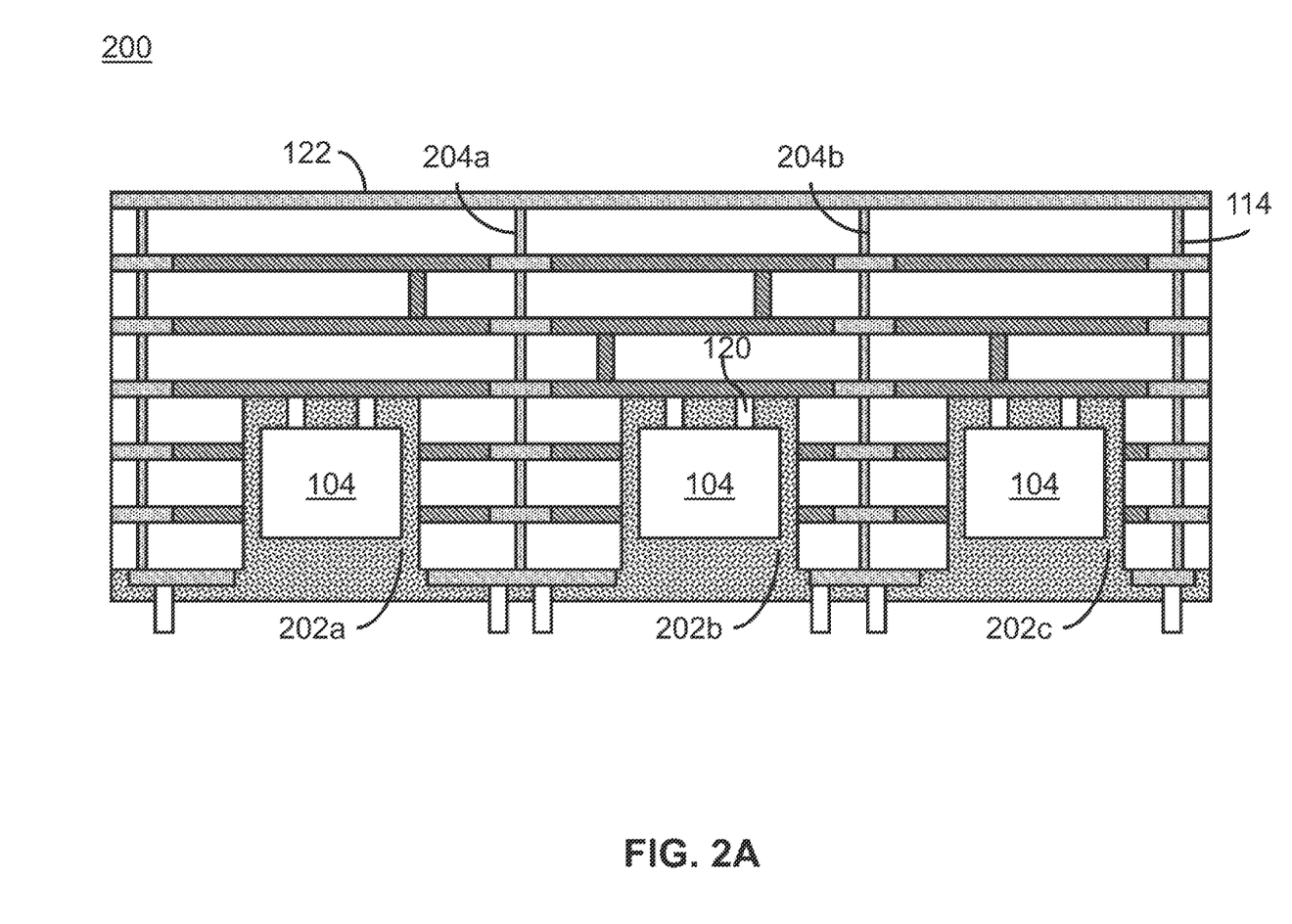
FIG. 2A depicts a side view of module including a printed circuit board with multiple cavities, in accordance with one or more embodiments of the present disclosure.
Figure 2B:
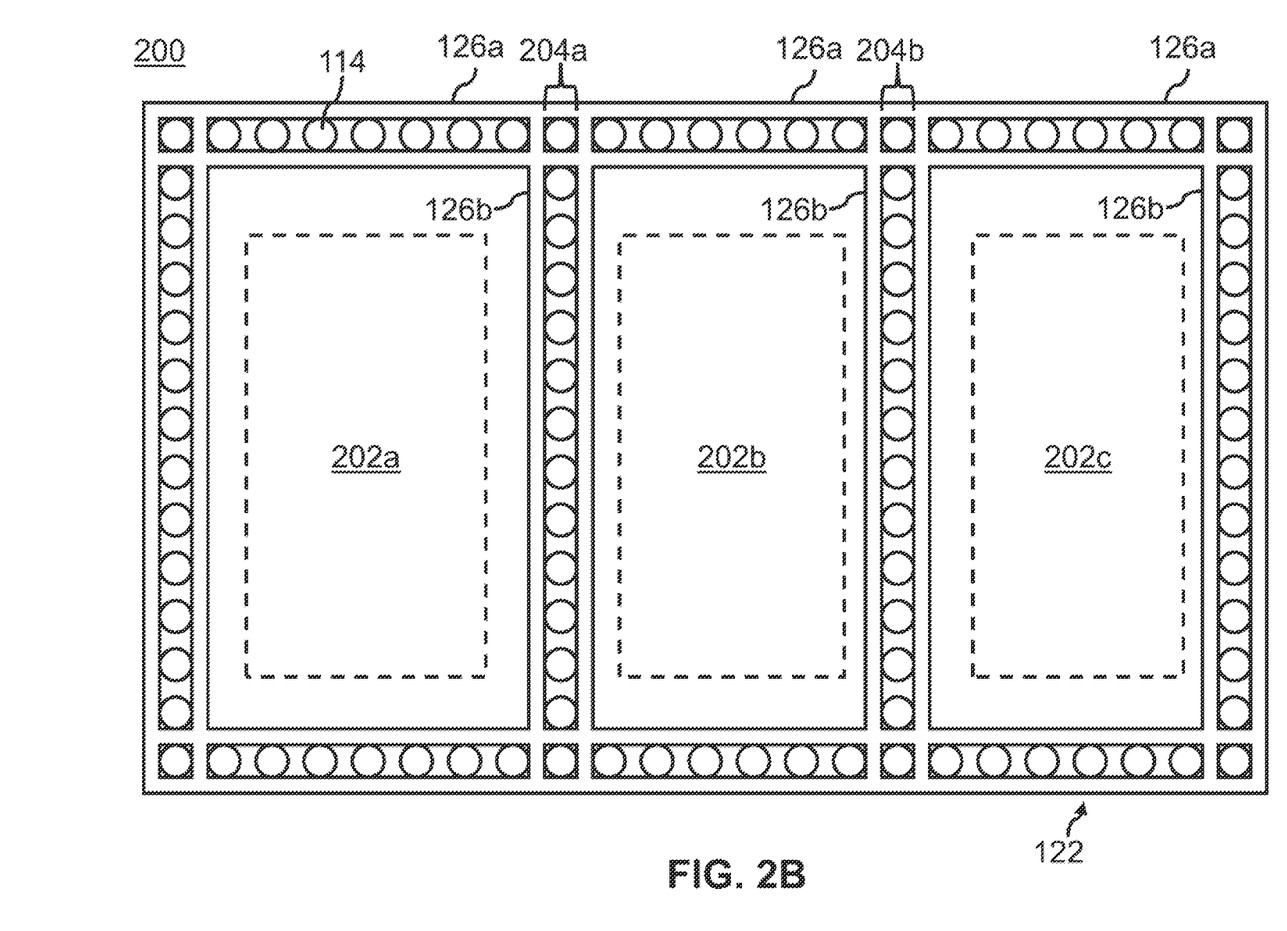
FIG. 2B depicts a top view of module including a printed circuit board with multiple cavities, in accordance with one or more embodiments of the present disclosure.

Referring now to FIGS. 2A-2B, a module 200 is described, in accordance with one or more embodiments of the present disclosure. The embodiments and the enabling technology described previously herein in the context of the module 100 should be interpreted to extend to the module 200. The module 200 may depict via-walls internal to the printed circuit board 102 to provide shielding between multiple cavities.

The module 200 may include any number of cavities 202. Each of the cavities 202 may include one or more dies 104. The number of the cavities 202 may be selected based on the desired number of the dies 104. In one example, the cavity 202a may include power amplifier (PA) cores, the cavity 202b may include multiplexers and/or switches, and the cavity 202c low noise amplifiers (LNAs). The dies may be selected based on the module architecture, such that the power amplifier cores, the multiplexers, switches, and low noise amplifiers are not intended to be limiting.

In embodiments, the module 200 may provide EMF shielding between the cavities 202. The EMF shielding may be provided between the dies 104 which are disposed within the cavities 118 of the printed circuit board 102. The EMF shielding may be advantageous to increase the functionality of the module 100. Thus, additional of the dies 104 may be added to the module 200 to increase the functionality of the module 100 without increasing the EMF/EMI between the dies.

In embodiments, the through vias 114 may arranged in one or more rows 204. In embodiments, the rows 204 may act as a via wall or internal shield between the cavities 202. The through vias 114 may be between the cavities 202. Thus, the through vias 114 may both provide shielding to and from external EMF but also shielding to and from EMF internal to and between the dies 104. For example, the module 200 is depicted as including the cavities 202a-202c and the rows 204a-204b. The row 204a of the through vias may be disposed between the cavity 202a and the cavity 202b. The row 204b of the through vias may be disposed between the cavity 202b and the cavity 202c. As may be understood, the term row may also mean apply columns of the through vias depending upon the orientation in which the module 200 is viewed. Each of the cavities 202 may include the first portion 126a of the metal trace 122 arranged outside the pattern defining the through vias 114 and including the second portion 126b of the metal trace 122 arranged inside the pattern defining the through vias 114. The grid pattern may also include coupling the first portion 126a and the second portion 126b at the corner through vias for each of the cavities 202. The metal trace 122 for each of the cavities 202 may also be coupled at the corner through vias.

In embodiments, the spacing between the through vias 114 may vary. The spacing between the through vias 114 may vary between the rows 204. The spacing may be selected based on the dies within the respective cavities 202. In particular, the via spacing may be decreased where the frequency is higher and may be increased where the frequency is lower. The spacing may be selected such that the spacing is order of the quarter wavelength or lower. Such spacing on the order of the quarter wavelength or lower may be desirable to achieve sufficient attenuation of the EMF. However, increasing the spacing may be desirable to reduce the number of fabrication steps to make the module 200 (e.g., number of drillings where the through vias are fabricated by drilling). For example, the row 204a may include a first spacing between adjacent through vias and the row 204b may a second spacing between adjacent through vias, where the first spacing is greater than the second spacing.

Figure 3:
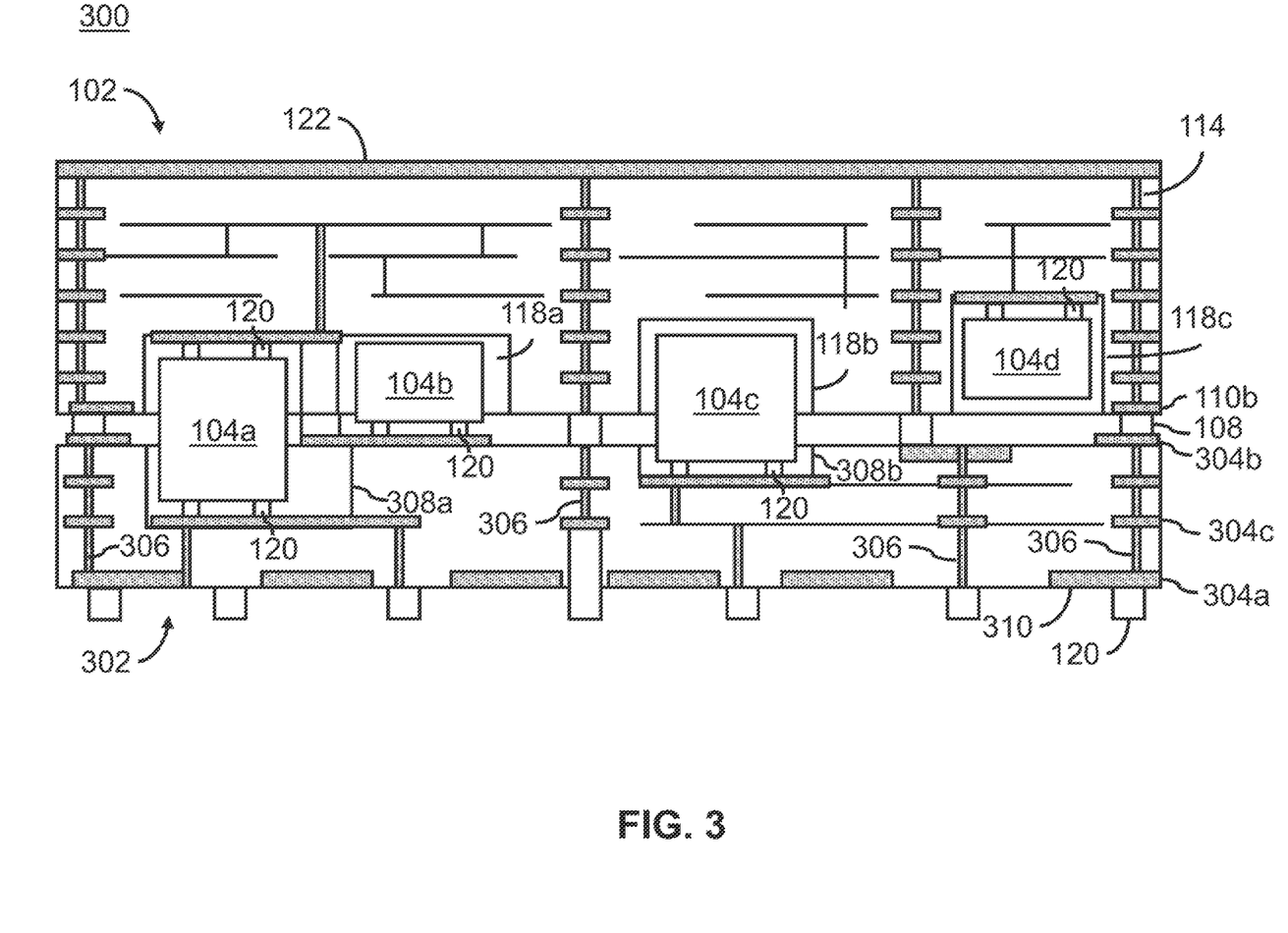
FIG. 3 depicts a side view of module including a first printed circuit board and a second printed circuit board, in accordance with one or more embodiments of the present disclosure.

Referring now to FIG. 3, a module 300 is described, in accordance with one or more embodiments of the present disclosure. The embodiments and the enabling technology described previously herein in the context of the module 100 and the module 200 should be interpreted to extend to the module 300. The module 300 may depict a stacked PCB configuration. The module 300 may include the printed circuit board 102 and a printed circuit board 302. The printed circuit board 102 may be stacked on the printed circuit board 302. The stacked PCB configuration may provide both external and internal shielding as will be described.

In embodiments, the printed circuit board 302 may include, be coupled to, or define one or more of the one or more of the dies 104, mold 106, interconnects 108, metal layers 110 (e.g., metal layer 304), insulating layers 112, through vias 114 (e.g., through vias 306), annular rings 116, cavity 118 (e.g., cavity 308), interconnects 120, and/or metal trace 122 (e.g., metal trace 310). The discussion of the printed circuit board 102 is incorporated herein by reference in regards to the printed circuit board 302. For example, the metal layers 304 may include a first metal layer 304a, a second metal layer 304b, and one or more intermediate metal layers 304c. By way of another example, the printed circuit board 302 may define one or more of the cavities 308 recessed from the second metal layer 304b.

In embodiments, the printed circuit board 302 may be considered a multilayer PCB. The printed circuit board 302 may include multiple layers of the metal layers 304 and multiple layers of the dielectric layers. The metal layers 304 may include a first metal layer 304a, a second metal layer 304b, and one or more intermediate metal layers 304c. For example, the printed circuit board 302 is depicted as including four of the metal layers 304 which are each separated by the dielectric layers, although this is not intended to be limiting. For the example depicted with four of the metal layers, the first metal layer 304a may be referred to as a metal 1 (M1) layer and the second metal layer 304b may be referred to as a metal layer 4 (M4), with the intermediate metal layers 304c referred to as metal layers 2 through 3 (M2 through M3). The concepts may be extended to a PCB including any number (n) of the layers (e.g., Mn).

In embodiments, the printed circuit board 302 may define one or more of the cavities 308. In this regard, the printed circuit board 302 may referred to as a cavity PCB. The cavities 308 may be recessed from the second metal layer 304b. As depicted, the cavity 308 is formed on the top surface, although this is not intended to be limiting. The intermediate metal layers 304c may include a metal layer disposed in the cavity 308. The depth of the cavity 308 may be selected based on a distance to the desired intermediate metal layer. For the example depicted, the cavity 308a includes a cavity depth of two layers from the metallization layer M4 thereby exposing metallization layer M2 and the cavity 308b includes a cavity depth of one layer from the metallization layer M4 thereby exposing metallization layer M3, although this is not intended to be limiting. Thus, the cavity 118 exposes one of the one or more intermediate metal layers 110c.

In embodiments, the module 300 includes one or more of the dies 104. The cavity 308 may be configured to receive the dies 104. In embodiments, the dies 104 may be disposed within the cavities 308. Disposing the dies 104 within the cavity 308 may lower the standoff height of the dies 104 relative to the printed circuit board 302, as compared to attaching the dies 104 on the surface of the printed circuit board 302. In embodiments, the dies 104 may be electrically coupled to the intermediate metal layer by way of the interconnects 120, although this is not intended to be limiting.

In embodiments, the printed circuit board 302 includes a shielding structure. The shielding structure may reduce or block a strength of the EMF passing to and from the cavity 308. The shielding structure may include, but is not limited to, the through vias 306, the annular rings 116, and/or a metal trace 310. The through vias 306, the annular rings 116, and/or the metal trace 310 may be configured to reduce or block a strength of the EMF passing to and from the cavity 308. The through vias 306, the annular rings 116, and/or the metal trace 310 may internal to the printed circuit board 102.

The through vias 306 may be coupled between the first metal layer 304a and the second metal layer 304b (e.g., through the printed circuit board 302, from a top surface to a bottom surface). In embodiments, the through vias 306 are arranged around a perimeter of the cavities 308. The through vias 306 may be considered to form a via-wall by the spacing. The through vias 306 may isolate the cavity 308 from the EMF around the sides of the printed circuit board 302. Advantageously, the through vias 306 may provide such isolation internally to the printed circuit board 302. In embodiments, the perimeter of the cavity 308 is rectangular. In this regard, the perimeter of the through vias 306 may also be rectangular when arranged around the perimeter of the cavity 308.

In embodiments, the first metal layer 304a may include the metal trace 310. The metal trace 310 of the first metal layer 304a may act as an EMF shield for the bottom of the printed circuit board 302. The metal trace 310 may couple each of the through vias 306 to the adjacent through vias. The metal trace 310 may then provide the EMF shielding. In embodiments, the metal trace 310 is coupled to the through vias 306 in a grid pattern. The grid pattern of the metal trace 310 may be around and/or inside a perimeter of the through vias 306 (see FIG. 1A, FIG. 2A for example). In embodiments, the metal trace 310 is in a rectangular grid pattern where the perimeter of the cavity 308 and the perimeter of the through vias 306 are rectangular. Thus, the metal trace 310 may provide EMF shielding for the bottom of the printed circuit board 302.

In embodiments, one or more of the through vias 114 of the printed circuit board 102 may be coupled to one or more of the through vias 306 of the printed circuit board 302. For example, the through vias 114 may be coupled to the through vias 306 by way of the second metal layer 110b, the interconnects 108, and the second metal layer 304b.

In embodiments, the metal trace 122 of the printed circuit board 102 may provide EMF shielding for the top of the module 300. In embodiments, the through vias 114 and the through vias 306 may provide EMF shielding for the sides of the module 300. In embodiments, the metal trace 310 may provide EMF shielding for the bottom of the module 300. In this regard, the printed circuit board 102 does not need to include the metal trace 124 to provided EMF shielding from the bottom of the module 300. Similarly, the printed circuit board 302 does not need to include a metal trace in the metal layer 304b for EMF shielding the top of the module 300.

As depicted, the module 300 includes four of the dies 104 (e.g., die 104a, die 104b, die 104c, die 104d), although this is not intended to be limiting. The die 104a may be electrically coupled to the printed circuit board 102 within the cavity 118a and to the printed circuit board 302 within the cavity 308a. The die 104b may be partially disposed within the cavity 118a and electrically coupled to the second metal layer 304b (e.g., to the top surface of the printed circuit board 302). The die 104c may be received within the cavity 118b and electrically coupled to the printed circuit board 302 within the cavity 308b (e.g., to the intermediate metal layer 304c, or M3). The die 104d may be electrically coupled to the printed circuit board 102 within the cavity 118c (e.g., to the intermediate metal layer 304c, or M4). Thus, both the of the printed circuit board 102 and the printed circuit board 302 may include or be coupled to one or more of the dies 104.

In embodiments, the die 104a, the die 104b, and the die 104c are placed on and coupled to the printed circuit board 302. In embodiments, the die 104d is placed on and coupled to the printed circuit board 102. The printed circuit board 102 may then be flipped over and stack on the printed circuit board 302. The printed circuit boards may then be soldered or assembled together. The dies 104 may then be enclosed providing EMF shielding.

Referring generally again to FIGS. 1A-3.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

It is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented. It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. A printed circuit board comprising:
   a plurality of metal layers, the plurality of metal layers comprising a first metal layer, a second metal layer, and one more intermediate metal layers, wherein the one or more intermediate metal layers are disposed between the first metal layer and the second metal layer, wherein the first metal layer comprises a metal trace; one or more dielectric layers, wherein the one or more dielectric layers comprise a first dielectric layer disposed between the first metal layer and the one or more intermediate metal layers, wherein the one or more dielectric layers comprise a second dielectric layer disposed between the one or more intermediate metal layers and the second metal layer, wherein a first cavity is defined in the second metal layer; and
   a plurality of through vias, wherein the plurality of through vias are coupled between the first metal layer and the second metal layer, wherein the plurality of through vias are arranged around a perimeter of the first cavity, wherein the metal trace couples the plurality of through vias, wherein the plurality of metal layers each comprise a plurality of annular rings, wherein the plurality of through vias are each coupled to one of the plurality of annular rings in each layer of the plurality of metal layers.

2. The printed circuit board of claim 1, wherein the metal trace couples the plurality of through vias in a grid pattern.

3. The printed circuit board of claim 2, wherein the perimeter of the first cavity is rectangular, wherein the plurality of through vias are arranged around the perimeter of the first cavity in a rectangular pattern.

4. The printed circuit board of claim 3, wherein the second metal layer comprises an additional metal trace, wherein the additional metal trace couples the plurality of through vias in the grid pattern.

5. The printed circuit board of claim 3, wherein a distance between adjacent through vias of the plurality of through vias arranged in the rectangular pattern is between 20 mils and 50 mils.

6. The printed circuit board of claim 1, wherein the metal trace and the plurality of through vias are configured to reduce a strength of electromagnetic fields from passing to and from the first cavity.

7. The printed circuit board of claim 1, wherein one or more additional cavities are defined in the second metal layer, wherein the plurality of through vias are arranged around a perimeter of the one or more additional cavities, wherein the metal trace and the plurality of through vias are configured to reduce a strength of electromagnetic fields passing between the first cavity and the one or more additional cavities.

8. The printed circuit board of claim 1, wherein the one or more intermediate metal layers comprise a metal layer disposed in the first cavity, wherein the metal layer disposed in the first cavity comprises one or more interconnects.

9. The printed circuit board of claim 1, further comprising one or more interconnects, wherein the one or more interconnects are disposed below the second metal layer, wherein the plurality of through vias are coupled to the one or more interconnects for grounding the metal trace and the plurality of through vias to the one or more interconnects.

10. The printed circuit board of claim 9, wherein the one or more interconnects comprises at least one of a bump, a solder pad, or a solder ball.

11. An apparatus comprising:
    a printed circuit board comprising:
        a plurality of metal layers, the plurality of metal layers comprising a first metal layer, a second metal layer, and one more intermediate metal layers, wherein the one or more intermediate metal layers are disposed between the first metal layer and the second metal layer, wherein the first metal layer comprises a metal trace;

one or more dielectric layers, wherein the one or more dielectric layers comprise a first dielectric layer disposed between the first metal layer and the one or more intermediate metal layers, wherein the one or more dielectric layers comprise a second dielectric layer disposed between the one or more intermediate metal layers and the second metal layer, wherein a first cavity is defined in the second metal layer, wherein the one or more intermediate metal layers comprises a metal layer disposed in the first cavity; and a plurality of through vias, wherein the plurality of through vias are coupled between the first metal layer and the second metal layer, wherein the plurality of through vias are arranged around a perimeter of the first cavity, wherein the metal trace couples the plurality of through vias; and a die, wherein the die is coupled to the metal layer disposed in the first cavity, wherein the metal trace is coupled to the plurality of through vias in a grid pattern, wherein the perimeter of the first cavity is rectangular, wherein the plurality of through vias are arranged in a rectangular pattern around the cavity, and wherein a distance between adjacent through vias of the plurality of through vias arranged in the rectangular pattern is between 20 and 50 mils.

12. The apparatus of claim 11, wherein the printed circuit board is a first printed circuit board, the apparatus comprising:

a second printed circuit board, the second printed circuit board comprising a plurality of additional through vias, wherein the second metal layer of the first printed circuit board is coupled to the second printed circuit board, wherein the plurality of through vias are coupled to the plurality of additional through vias.

13. The apparatus of claim 12, wherein the second printed circuit board comprises a plurality of metal layers, the plurality of metal layers of the second printed circuit board comprising a first metal layer, a second metal layer, and one or more intermediate metal layers, wherein the second metal layer of the first printed circuit board is coupled to the second metal layer of the second printed circuit board.

14. The apparatus of claim 13, wherein the second metal layer defines an additional cavity, wherein the plurality of additional through vias are arranged around a perimeter of the additional cavity.

15. The apparatus of claim 14, wherein the die is electrically coupled to the first printed circuit board within the first cavity and to the second printed circuit board within the additional cavity.

16. The apparatus of claim 14, further comprising an additional die, wherein the additional die is partially disposed within the first cavity and is electrically coupled to the second metal layer of the second printed circuit board.

17. An apparatus, comprising: a printed circuit board comprising:

a plurality of metal layers, the plurality of metal layers comprising a first metal layer, a second metal layer, and one more intermediate metal layers, wherein the one or more intermediate metal layers are disposed between the first metal layer and the second metal layer, wherein the first metal layer comprises a metal trace;

one or more dielectric layers, wherein the one or more dielectric layers comprise a first dielectric layer disposed between the first metal layer and the one or more intermediate metal layers, wherein the one or more dielectric layers comprise a second dielectric layer disposed between the one or more intermediate metal layers and the second metal layer, wherein a first cavity is defined in the second metal layer, wherein the one or more intermediate metal layers comprises a metal layer disposed in the first cavity; and a plurality of through vias, wherein the plurality of through vias are coupled between the first metal layer and the second metal layer, wherein the plurality of through vias are arranged around a perimeter of the first cavity in a rectangular pattern, wherein the perimeter of the first cavity is rectangular, wherein the metal trace couples the plurality of through vias in a grid pattern, wherein the grid pattern comprises a first portion of the metal trace arranged outside the rectangular pattern, wherein the grid pattern comprises a second portion of the metal trace arranged inside the rectangular pattern, wherein the plurality of metal layers each comprise a plurality of annular rings, wherein the plurality of through vias are each coupled to one of the plurality of annular rings in each layer of the plurality of metal layers.

* * * * *